United States Patent [19]
Hshieh et al.

[11] Patent Number: 6,025,230
[45] Date of Patent: Feb. 15, 2000

[54] HIGH SPEED MOSFET POWER DEVICE WITH ENHANCED RUGGEDNESS FABRICATED BY SIMPLIFIED PROCESSES

[75] Inventors: Fwu-Iuan Hshieh, Saratoga; Koon Chong So, San Jose, both of Calif.

[73] Assignee: Mageposer Semiconductor Corporation, San Jose, Calif.

[21] Appl. No.: 08/965,349

[22] Filed: Nov. 6, 1997

[51] Int. Cl.[7] .......................... H01L 21/336; H01L 21/76
[52] U.S. Cl. ........................... 438/268; 438/404; 438/412
[58] Field of Search .................................. 438/268, 272, 438/404, 412

[56] References Cited

U.S. PATENT DOCUMENTS

| | | | |
|---|---|---|---|
| 4,187,514 | 2/1980 | Tomisawa et al. | 357/22 |
| 5,192,708 | 3/1993 | Beyer et al. | 437/90 |
| 5,362,668 | 11/1994 | Tasaka | 437/67 |
| 5,492,858 | 2/1996 | Bose et al. | 437/67 |
| 5,498,566 | 3/1996 | Lee | 437/67 |
| 5,516,625 | 5/1996 | McNamara et al. | 430/414 |
| 5,665,622 | 9/1997 | Muller et al. | 438/22 |
| 5,710,073 | 1/1998 | Jeng et al. | 438/239 |
| 5,882,981 | 3/1999 | Rajgopal et al. | 438/404 |

*Primary Examiner*—John F. Niebling
*Assistant Examiner*—Michael S. Lebentritt
*Attorney, Agent, or Firm*—Bo-In Lin

[57] ABSTRACT

This invention discloses a MOSFET power device supported on a substrate. The MOSFET power device includes a plurality polysilicon-with-oxide-cap segments disposed over a gate oxide layer including two outermost segments and a plurality of inner segments include a plurality of gate oxide-plug openings. Each of the inner segments functions as a gate and the two outer most segments function as a field plate and an equal potential ring separated by a termination oxide-plug gap and the gate oxide-plug openings and the termination oxide-plug gap having an aspect ratio greater or equal to 0.5. The MOSFET power device further includes a plurality of MOSFET transistor cells for each of the gates, wherein each transistor cells further includes a source region, a body region, the transistor cells further having a common drain disposed at a bottom surface of the substrate. Each of the inner segments functions as a gate having a side wall spacer surrounding edges of the inner segments, and the gate oxide-plug openings and the termination oxide-plug gap being filled with an oxide plug. The MOSFET transistor cells are covered by an overlying insulation layer having a plurality of contact openings defined therein. The MOSFET power device further includes a plurality of metal segments covering the overlying insulation layer and being in electric contact with the DMOS device through the contact opening. The MOSFET power device further includes a plurality of deep-and-narrow gaps between the metal segments wherein each gap having an aspect ratio equal to or greater than 0.5.

19 Claims, 11 Drawing Sheets

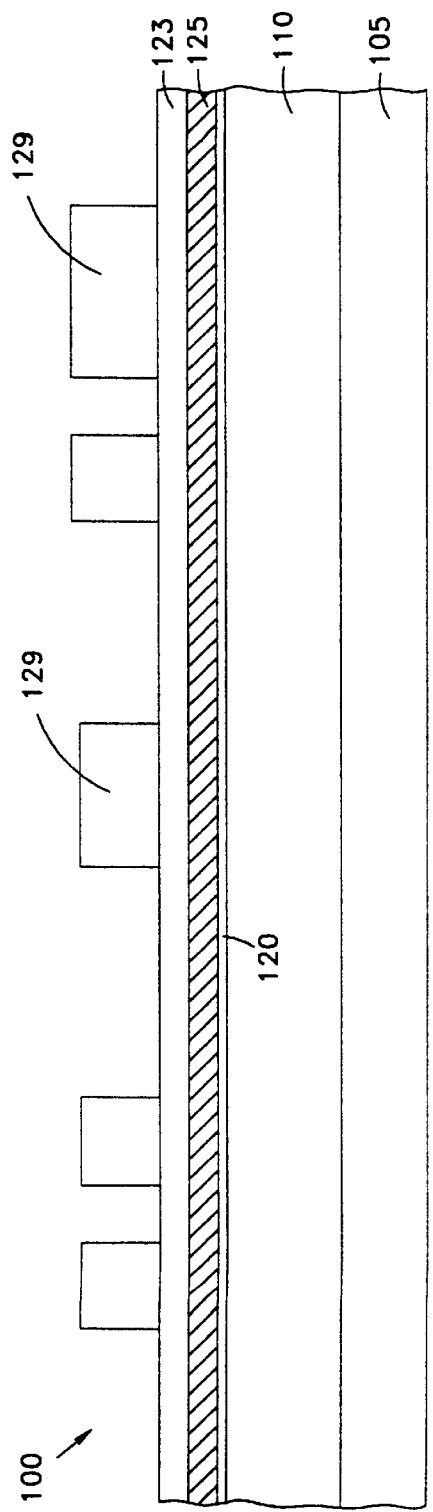
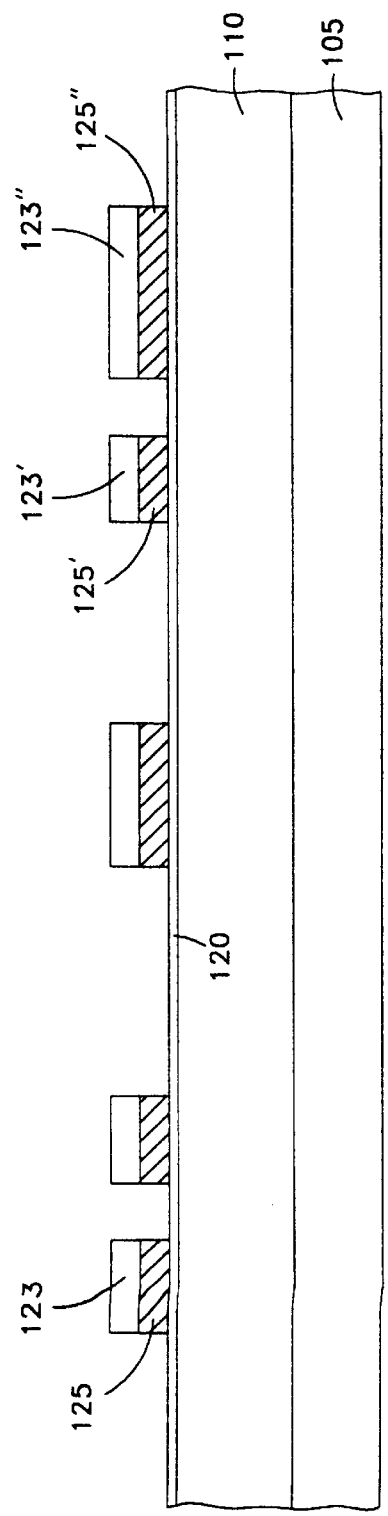

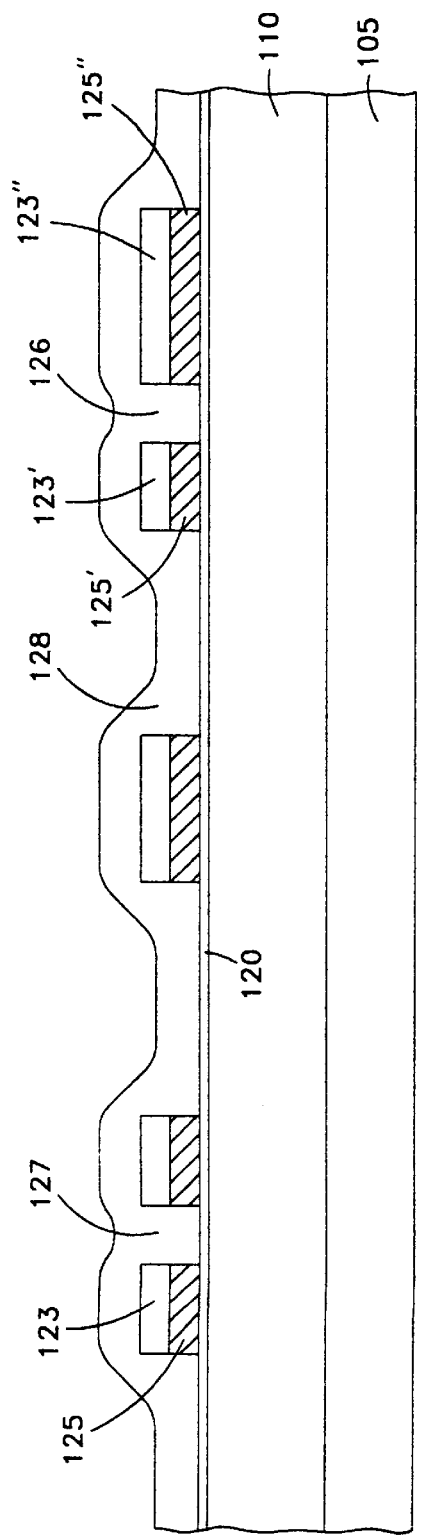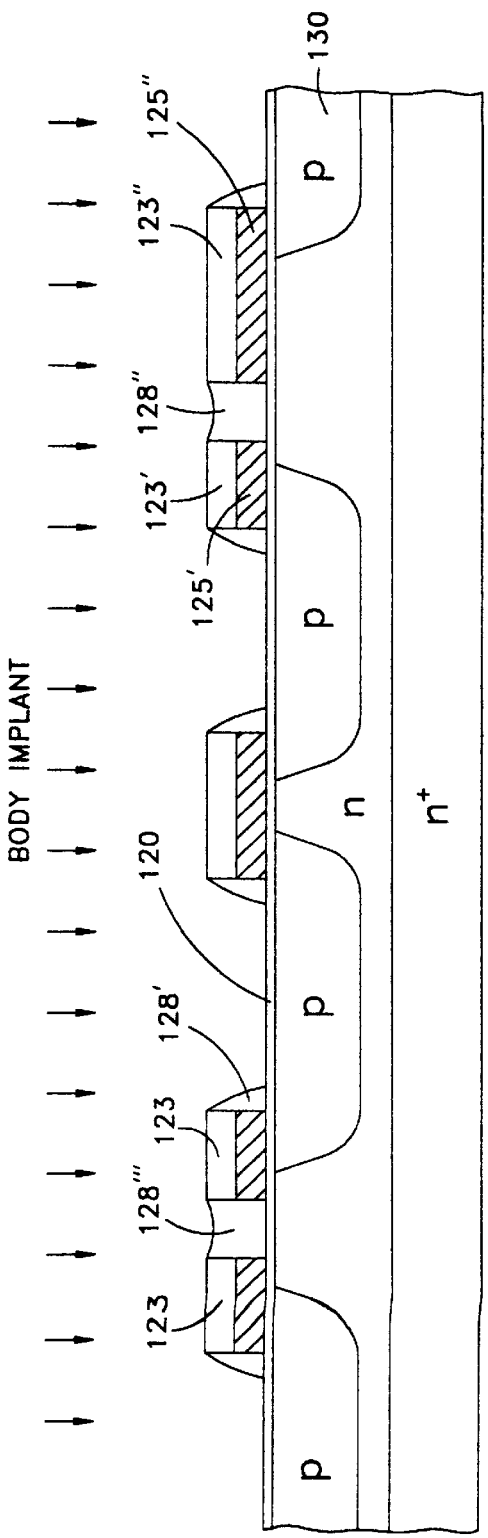

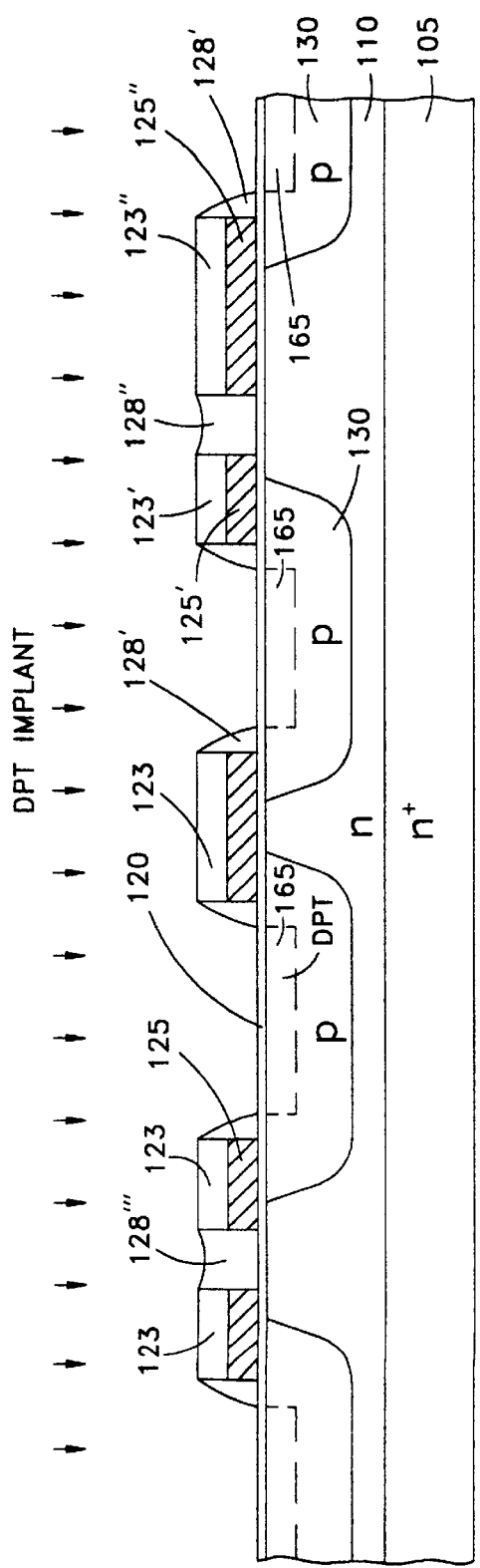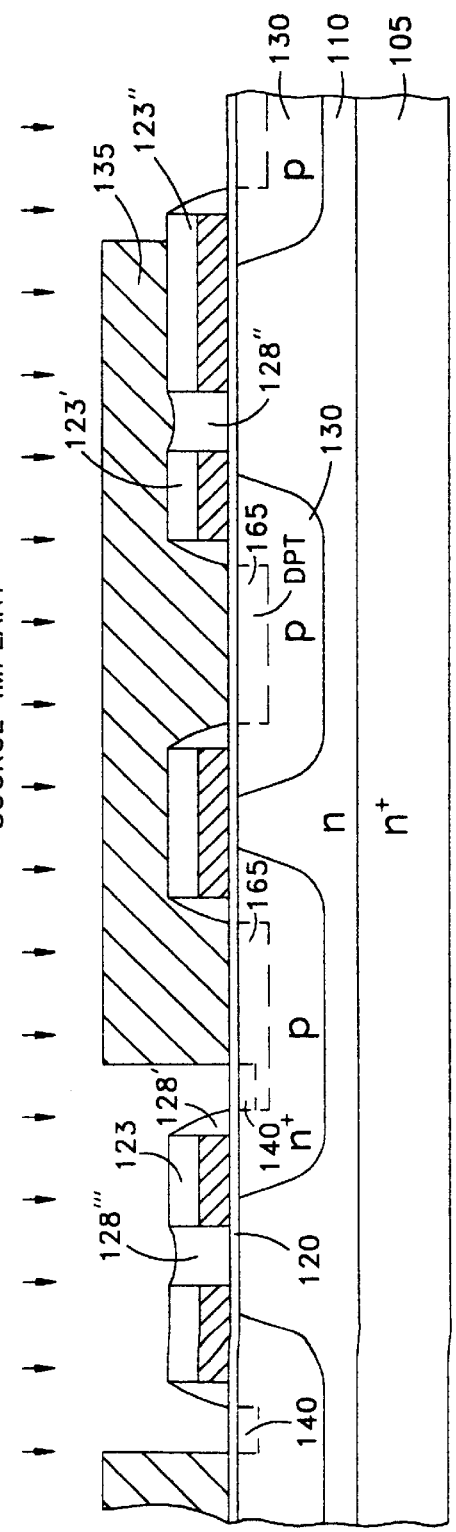

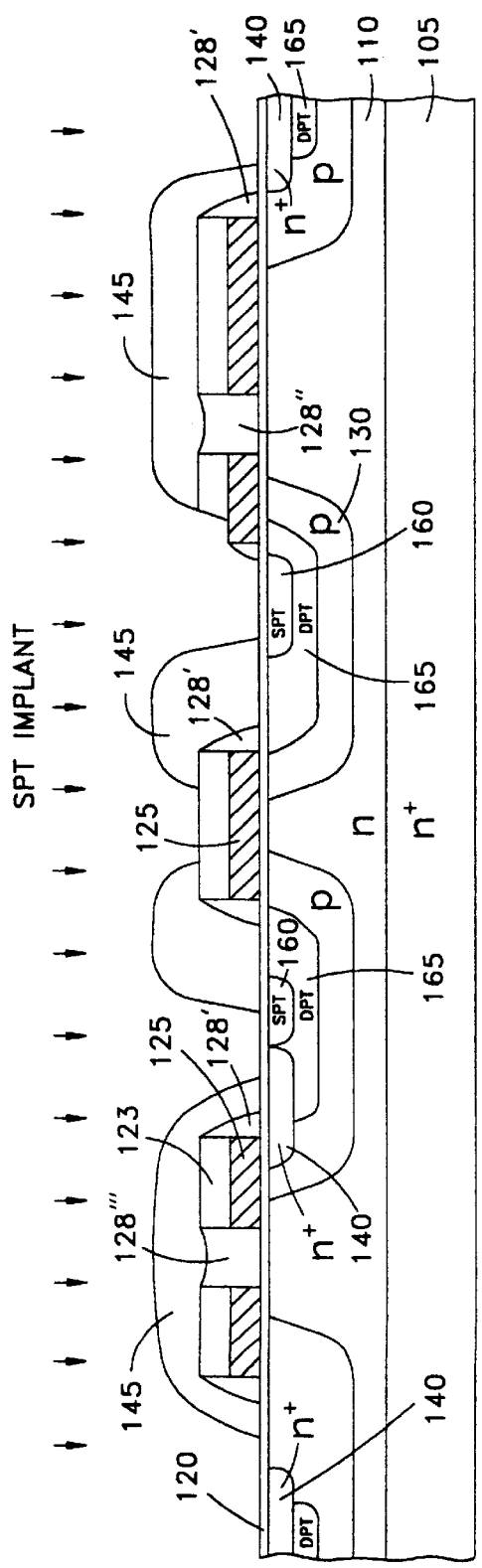
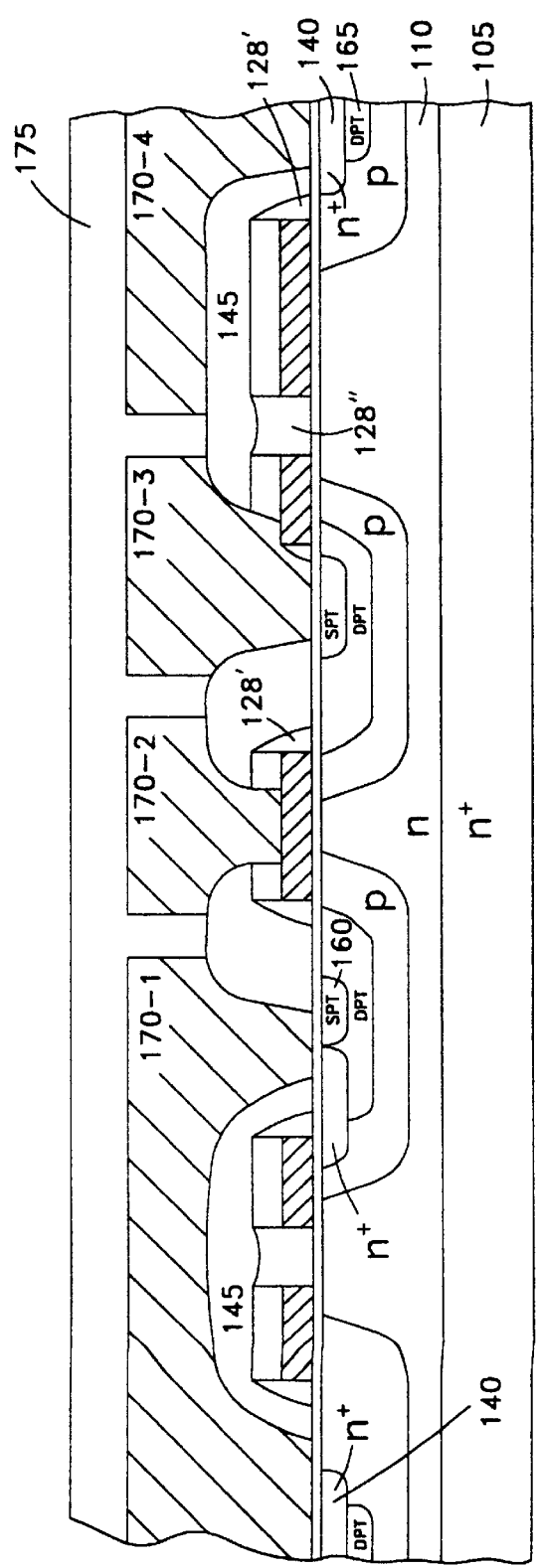
FIG. 5G
FIG. 5H

HIGH SPEED MOSFET POWER DEVICE WITH ENHANCED RUGGEDNESS FABRICATED BY SIMPLIFIED PROCESSES

BACKGROUND OF THE INVENTION

1. Field of the Invention

This invention relates generally to the structure and fabrication process of MOSFET power devices. More particularly, this invention relates to a novel and improved MOSFET device structure and fabrication process wherein specially configured gates are formed to reduce the gate capacitance such that the speed of the MOSFET device is increased and devices can be manufactured with simplified method at lower cost while the device reliability is improved.

2. Description of the Prior Art

The goal of increasing the switching speed and meanwhile reducing the production cost of the MOSFET power device cannot be easily achieved. This is particularly true when the power MOSFET devices become more complicate both in cell structure and in device topology. In the meantime, in order to achieve higher switching speed, it is desirable to reduce the gate-to-drain capacitance. However, a device structure capable of providing such performance improvement typically involves the application of more complex fabrication processes. As the fabrication processes become more complex and increased number of masks are required, longer manufacture time cycles become necessary which leads to higher production costs. Complex fabrication processes with increased number of masks introduce further concerns. As more masks and processing steps are applied, more uncertainties of production yield and product reliability are introduced. The production costs are further impacted due to these undesirable factors. For these reasons, many technical improvements are attempted to improve the device performance to achieve higher switching speed while reducing the number of masks employed for MOSFET fabrication. Several MOSFET device structures and manufacture techniques are also disclosed in U.S. Patents.

In U.S. Pat. No. 5,404,040 entitled "Structure and Fabrication of Power MOSFETS including Termination Structures" (issued on Apr. 4, 1994), Hshieh et al. disclose a power MOSFET, as that shown in FIG. 1. The MOSFET is manufactured by a five mask process on a semiconductor body 2000 and 2001. A first insulating layer 2002 lies over the active and termination areas. A main polysilicon portion, 2003C and 2003B, lies over the first insulating layer largely above the active area. Also a first and second peripheral polysilicon segments 2003C1 and 2003C2 lie over the first insulating layer above the termination area which are etched as two separated segments with a separating gap 2013E. A gate electrode 2016 contacts the main polysilicon potion. Two source electrodes, 2015A and 2015B, are formed to contact the active area, the termination area and the first polysilicon segment 2003C1 through an opening in the second insulating layer 2012. The second polysilicon segment 2003C2 extends over a scribe line section of the termination area where the semiconductor is cut into separate dice. In this termination area, a metal portion is formed to contact this second polysilicon segment. During a dicing process, the second polysilicon segment and the metal portion are electrically shorted to the semiconductor body. The metal portion in combination of the second polysilicon segment are useful to equalize the potential at the outer peripheral of the MOSFET and reduces the likelihood of device malfunction.

The MOSFET as that shown in FIG. 1 presents several difficulties in the fabrication processes. Specifically, it is difficult to remove a silicon segment to form the gap 2013E for separating the first polysilicon segment 2003C1 from the second polysilicon segment 2013C2. If the gap 2013E is a small gap, then a wet etch process is not suitable due to its difficulties in controlling the etching dimensions. On the other hand, if a dry etch is applied in order to make the gap 2013E with a small gap-width, then the opening surface may be damaged as a result of dry etch process. In addition to the difficulties in manufacture, the structure in the termination area presents further difficulties and limitations. Due to the opening of this gap 2013E, a passivation layer is required to prevent mobile ions from entering into the device. As will be further discussed below, a requirement of applying a pad mask to define the passivation layer is necessary which results in more complicate manufacture processes and higher MOSFET production cost. Additionally, this configuration in the termination area causes a walk out phenomenon of the breakdown voltage. A more detail technical description will be provided below when a novel structural feature of this invention is disclosed to improve the termination configuration in order to resolve the walkout problems.

In another U.S. Pat. No. 5,268,586, entitled "Vertical Power MOS Device with Increased Ruggedness and Method of Fabrication", (issued on Dec. 7, 1993) Mukherjee et al. disclose a semiconductor device with improved ruggedness by forming a second body region, i.e., a second base region, within the first body region, under the source regions. As shown in a cross sectional view of FIG. 2A, the second body region is shallower than the first body region and is formed close to the channel region to reduce the parasitic resistance in the first body region. The lateral edges of the second body region are substantially aligned with the lateral edges of the gate electrode. The first body region and the source region are formed by sequential implantation through the polysilicon gate electrode using the polysilicon gate electrode as a self aligned mask. The second body region is then formed by body implantation, again, using the polysilicon gate as the implant mask, without substantial lateral diffusion. Since the second body region is formed without substantial lateral diffusion, very limited thermal budget is allowed for the this second body region. Reduction of the drain to source resistance is quite limited because, without enough diffusion process, this second body region is formed with reduced depth under the source regions. Furthermore, high contact resistance between the metal and the body region may occur due to a low P+ surface doping concentration as the net dopant concentration as a function of depth along the line A–A' shown in FIG. 2B. Additional difficulties of higher threshold voltage may also arise from lateral diffusion of the second body region to touch the channel region. Finally, a polysilicon layer of greater thickness employed in this structure may cause another problem. For high density DMOS device, poor metal coverage may occur when the re-firing of the thicker polysilicon layer to block the high energy body implant ions causes the contact openings to have high aspect ratio, i.e., high height to width ratio.

In another U.S. Pat. No. 5,273,922, entitled "High Speed Low Gate/Drain Capacitance DMOS Device", (issued on Dec. 28, 1993), as that shown in FIG. 3, Tsoi discloses a DMOS device with field oxide in the channel between adjacent transistors and an impurity implanted through the same opening in which the field oxide is formed. The gate is deposited over the field oxide and spaced from the supporting epitaxial layer by the field oxide to reduce the gate-to-drain capacitance. The implant impurity blow the field oxide reduce the on-resistance of the device. With these advantages achievable by Tsoi's DMOS device, it is however limited by a difficulty that the size of the transistors can not be further reduced to increase the cell density. The lateral dimension of a transistor cell is limited by a misalignment tolerance between the polysilicon gate and the field oxide. In order to avoid an increase in the device threshold voltage, the body regions must be kept at a certain distance away from the field oxide areas. However, since the body implant is not self aligned to the field oxide, sufficient space has to be allowed to accommodate potential misalignment errors within the alignment tolerances. The lateral dimensions of the transistor are prevented from being further reduced due to this requirement Therefore, there is still a need in the art of power device fabrication, particularly for DMOS design and fabrication, to provide a structure and fabrication process that would resolve these difficulties.

SUMMARY OF THE PRESENT INVENTION

It is therefore an object of the present invention to provide a new MOSFET fabrication process and a new device structure to enable those of ordinary skill in the art of MOSFET fabrication to reduce gate-to-drain capacitance to achieve higher device switching speed and meanwhile applying a simplified manufacturing process without required additional number of masks whereby the device performance and reliability are both improved such that aforementioned limitations and difficulties as encountered in the prior art can be overcome.

Specifically, it is an object of the present invention to provide an improved MOSFET structure and fabrication process wherein the an oxide plug is provided for each gate to reduce the effective charge retaining area for the gate to reduce the gate-to-drain capacitance with the gate oxide plug blocking the body dopant from entering the substrate near the channel regions such that the switching speed is improved and a low threshold voltage is maintained without increasing the number of masks required for manufacturing a MOSFET power device.

Another object of the present invention is to provide a novel MOSFET structure and fabrication process wherein the deep high body dopant concentration regions are implanted with self alignment with the high energy dopant ions blocked by gate-with-oxide-cap segments having oxide plugs filling the gate oxide-plug openings in the polysilicon layer and the side-wall spacers surrounding the edges of the gate-with-oxidecap segments such that the device ruggedness is improved without causing increase in threshold voltage.

Another object of the present invention is to provide a novel MOSFET structure and fabrication process wherein the deep high body dopant concentration regions are implanted after a body diffusion process such that with subsequent thermal cycles of lower temperature and shorter duration, the lateral diffusion of this deep high concentration body dopant region is limited without extending to a region near the channel and the potential difficulty of increasing the threshold voltage is resolved.

Another object of the present invention is to provide a novel MOSFET structure and fabrication process wherein the misalignment tolerances of the contact mask is increased with the side-wall spacers surrounding the edges of the gate-with-oxide-cap segments such that the process of applying the contact mask can be more easily carried out without being restrict by a stringent misalignment tolerance requirement.

Another object of the present invention is to provide a novel MOSFET structure and fabrication process wherein improved structure in the termination area is provided with a field plate (FP) insulated from an equal potential ring (EQR) by an oxide plug having about the same thickness of the field plate and equal potential ring to block the body dopant ions such that a thick initial oxide layer is no longer needed and the requirement of applying a separate active mask specifically for defining the active area by etching away a thick initial oxide layer is eliminated.

Another object of the present invention is to provide an improved MOSFET fabrication structure and process wherein the requirement of applying a separate pad masks specifically for defining the passivation layer to expose the areas above the source and gate metal segments are eliminated while a mobile ion blocking layer of greater thickness is provided such that the number of masks required to fabricate a MOSFET transistor can be reduced and the device reliability can be improved.

Another object of the present invention is to provide an improved MOSFET fabrication structure and process wherein a dry etch process is applied to etch the polysilicon covered with an oxide-cap layer to define the gate oxide-plug openings in the polysilicon layer with aspect ratio greater or equal to 0.5 such that a separate mask is not required to form a plurality of oxide plugs in the gate oxide-plug openings to reduce the gate-to-drain capacitance and to serve the functions of blocking body dopant ions from entering into the substrate through the gate oxide-plug openings in the gate polysilicon layer.

Briefly, in a preferred embodiment, the present invention includes a method for fabricating a MOSFET device supported on a substrate. The method includes the steps of (a) growing an oxide layer on the substrate and depositing a polysilicon layer followed by forming a oxide-cap layer overlying the polysilicon layer; (b) applying a gate mask for forming a plurality of polysilicon-with-oxide-cap segments including a plurality of inner gate-segments each having a gate oxide-plug opening and a field plate segment and an equal potential ring segment separated by a gap; (c) depositing a NSG layer overlying the top surface followed by applying an anisotropic dry etch for selectively removing the NSG layer, and forming an oxide plug filling the gate oxide-plug openings and filling a gap between the field plate and the equal potential ring (EQR) polysilicon segments and a plurality of side wall spacers around the gates; (d) implanting a body dopant followed by a body diffusion for forming body regions; (e) performing a high energy body dopant implant for forming deep high concentration body dopant regions in the body region; (f) applying a source mask for implanting a source dopant to form a plurality of source regions; (g) forming an overlying insulation layer covering the MOSFET device followed by applying a dry oxide etch with a contact mask to open a plurality of contact openings there-through; (h) performing a low energy body dopant implant to form a shallow high concentration body dopant in the body regions then removing the contact mask; (i) performing a high temperature reflow process for the overlying insulation layer and for driving the source regions and the shallow and deep high concentration body dopant regions into designed junction depths; (j) depositing a metal layer followed by applying a metal mask as a third mask for patterning the metal layer to define a plurality of metal segments by employing an anisotropic dry etch thus defining a plurality of deep-and-narrow gaps between the metal segments wherein each gap having an aspect ratio equal to or greater than 0.5; (k) depositing a passivation layer over an entire top surface and filling the deep-and-narrow gaps between the metal segments; and (l) etching away the passivation layer over the entire top surface without applying a mask while leaving the passivation layer inside the deep-and-narrow gaps substantially intact for serving a function of blocking mobile ions from entering into the MOSFET device.

These and other objects and advantages of the present invention will no doubt become obvious to those of ordinary skill in the art after having read the following detailed description of the preferred embodiment which is illustrated in the various drawing figures.

BRIEF DESCRIPTION OF THE DRAWINGS

FIGS. 5A to 5I show the processing steps for manufacturing a planar DMOS device of the present invention.

DETAILED DESCRIPTION OF THE PREFERRED EMBODIMENT

Figure 4A:
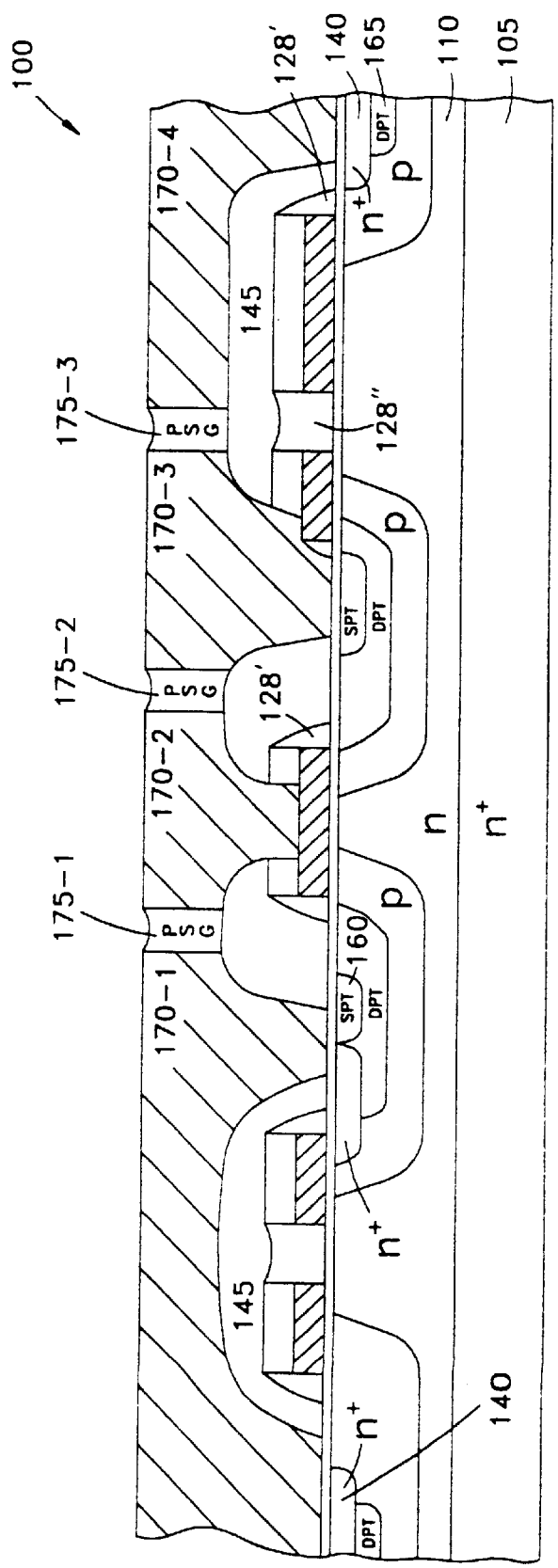
FIGS. 4A and 4B are respectively a cross sectional view and a top view of a preferred embodiment of the present invention.
Figure 4B:
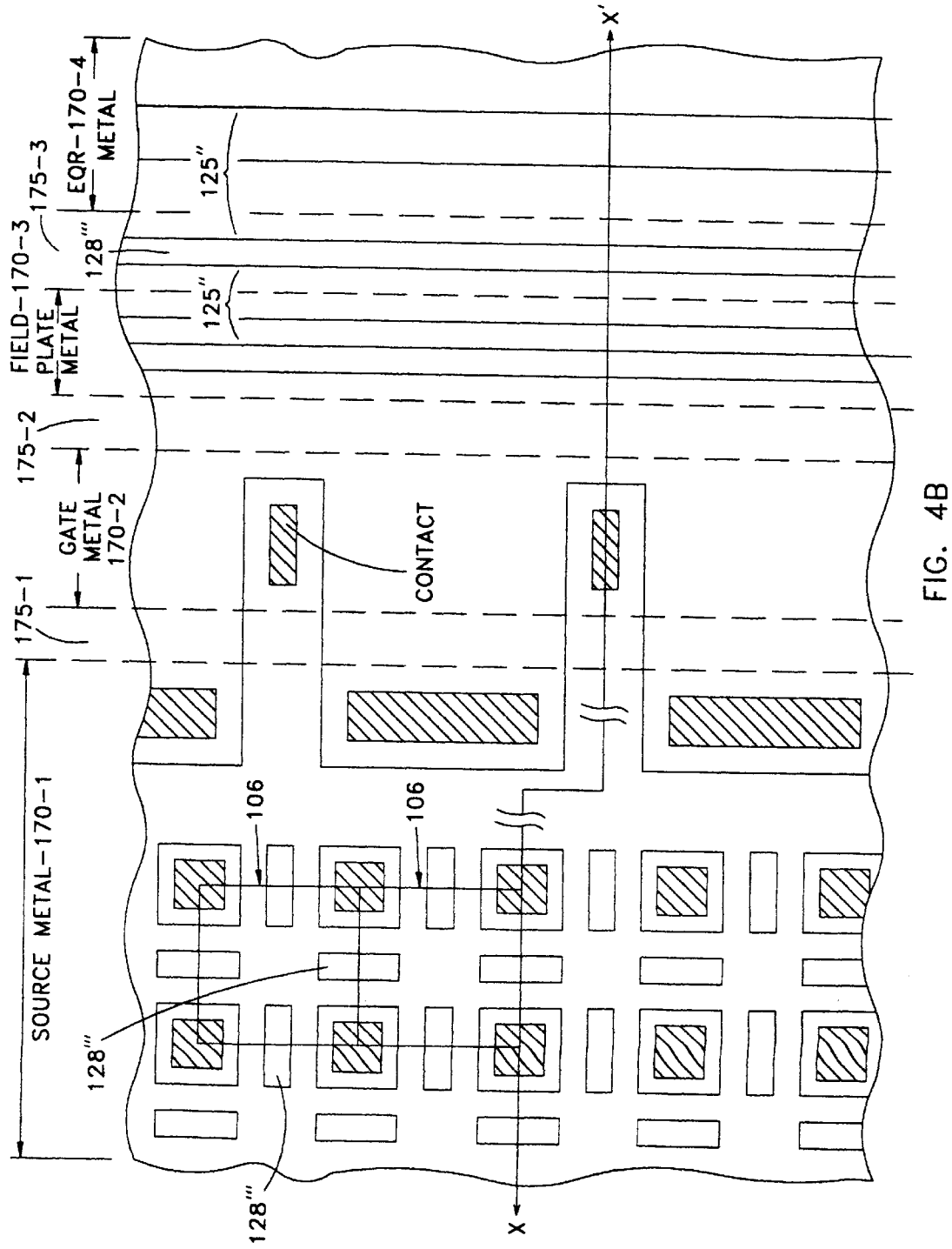

Referring to FIGS. 4A and 4B for a cross sectional view and a top view of a novel MOSFET power device 100 supported on a N+ substrate 105 functioning as a drain for the device. A N epitaxial layer 110 is formed over the substrate. The MOSFET power device 100 includes a plurality polysilicon-with-oxide-cap segments disposed over a gate oxide layer 120. The polysilicon-with-oxide-cap segments include two outermost segments 125' and 125" each covered with a oxide cap 123' and 123" respectively and a plurality of inner gapped-segments 125 each covered with a oxide-cap 123 wherein each of the inner gapped-segments 125 functioning as a gate and the two outermost segments 125' and 125" function as a field plate (FP) and an equal potential ring (EQR) respectively. These two outermost polysilicon-with-oxide-cap segments 125' and 125" together with their oxide-caps 123' and 123" are separated by termination oxide-plug gap 128" having an aspect ratio greater or equal to 0.5. The definition of the aspect ratio of the gate oxide-plug gap of the gapped gates and the termination oxide-plug gap 128" will be further described below in describing the fabrication processes.

The MOSFET power device 100 further includes a plurality of MOSFET transistor cells 106 for each of the gates 125, wherein each transistor cells 106 further includes a source region 140, a body region 130. The transistor cells 106 further have a common drain disposed at a bottom surface of the substrate 105. Each of the inner gapped-segments 125 functioning as a gate, further has a side wall spacer 128' surrounding edges of the inner segments 125 covered by the oxide-cap 123, and the termination oxide-plug gap 128" being filled with an oxide plug for separating the field plate 125' from the equal potential ring 125". Each of the gapped gate 125 covered with the oxide-cap 123 has a gate oxide-plug opening 127 opened in the middle portion between the source regions 140. Each of these gate oxide-plug openings 127 is also filled with a gate oxide plug 128'''. The gate oxide-plug openings 127 filled with a gate oxide plug 128''' and the termination oxide plug 128" serve the function for blocking the body ion from being implanted into the substrate regions below the oxide plugs 128''' and 128". The MOSFET cells are covered by an overlying insulation layer 145 having a plurality of contact openings. The MOSFET device further includes a plurality of metal segments, i.e., segments 170-1 (S), 170-2 (G), 170-3 (FP), and 170-4 (EQR), covering the overlying insulation layer and being in electric contact with the MOSFET device through the contact openings. The MOSFET transistor cells further includes plurality of deep-and-narrow gaps, 175-1 to 175-3 between the metal segments wherein each gap having an aspect ratio equal to or greater than 0.5. A passivation layer disposed in the deep-and narrow gaps 175-1 to 175-3 between the metal segments having a thickness substantially the same as the metal segments 170-1 to 170-4 for blocking mobile ions from entering into the MOSFET power device. These metal segments are a source metal 170-1, a gate metal 170-2, a field plate 170-3, and an equal potential ring (EQR) 170-4, separated from each other with the deep-and-narrow gaps 175-1 to 175-3.

As shown in FIG. 4A, the MOSFET power device 100 further provides a special structural feature in the termination area to avoid a breakdown walkout problem. Specifically, when applying a polysilicon mask to etch the polysilicon layer, the inner segment 125' covered with the oxide-cap 123' is formed to have a segment $D_{poly}$ where the segment width is less than the lateral diffusion length of the body dopant $D_L$ i.e., $$D_{poly} < D_L \qquad (1)$$

By making the segment width $D_{poly}$ less than the lateral diffusion length of the body dopant $D_L$ the p-body region 130 would then extend beyond the outer edge of the segment 125'. The distance which the p-body extends beyond the polysilicon segment 125' is represented by δ and $$\delta > 0 \qquad (2)$$

In this preferred embodiment, the gap between the field plate 125' covered by the oxide-cap 123' and the EQR 125" covered with the oxide-cap 123" now filled with an oxide plug 128" has a special width of approximately 0.5 to 2.0 micrometers, the segment width of the segment 125' is about 0.5–1.0 micrometer. Compared to prior art process, the fabrication process of this invention has the advantage the dimension of the gap width can be controlled with high precision when the polysilicon mask is applied. In contrast, in the prior art, the width of this segment cannot be easily controlled due to a greater alignment imprecision over thick layer of metal for etching and removing the gap, i.e., gap 2013E of Hshieh's prior art device.

Figure 1:
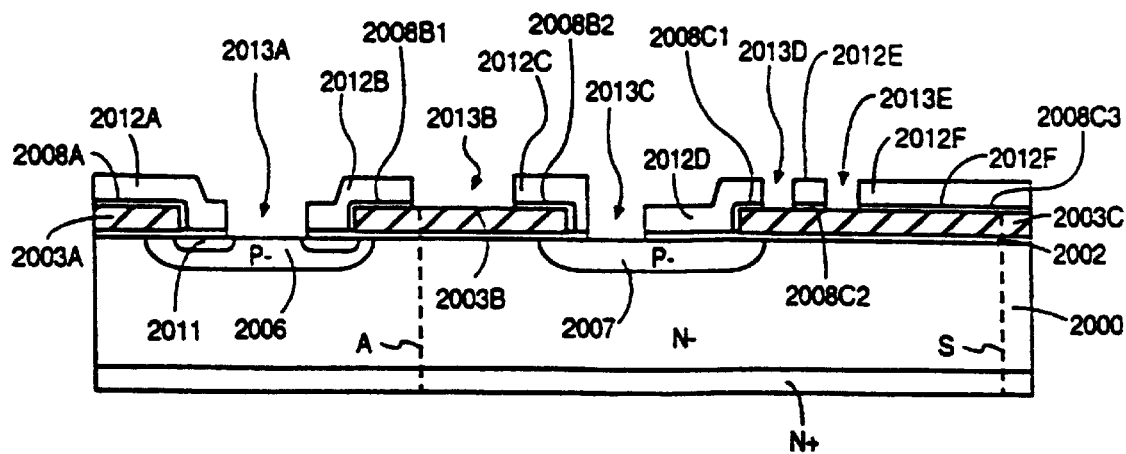
FIG. 1 is cross sectional view of a prior art MOSFET device manufactured with a five mask process with an improved termination structure.
Figure 2A:
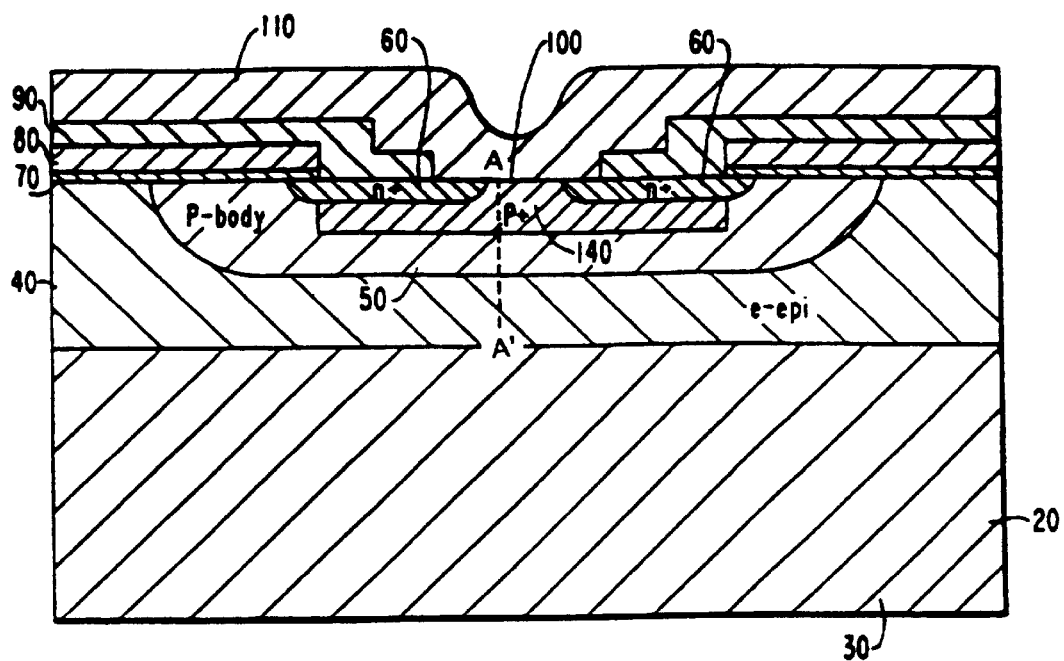
FIG. 2A is a cross-sectional view of another prior art MOSFET structure with a heavily doped body region underneath the source implanted by using the gate as dopant blocks without diffusion and aligned substantial with the edges of the gate to improve the device ruggedness.
Figure 2B:
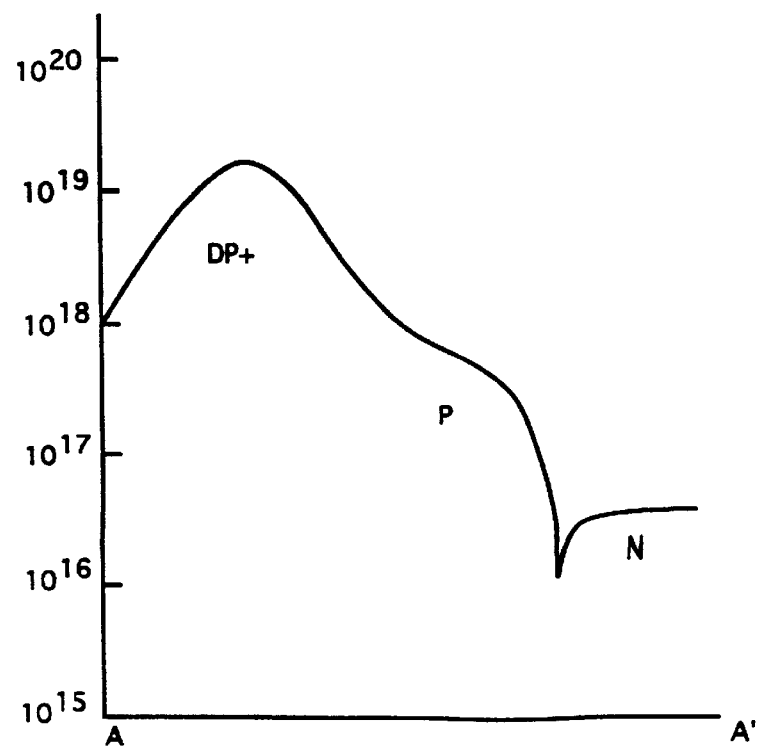
FIG. 2B shows the variation of the net dopant concentration as a function of the depth along a line A–A' of the MOSFET of FIG. 2A.
Figure 3:
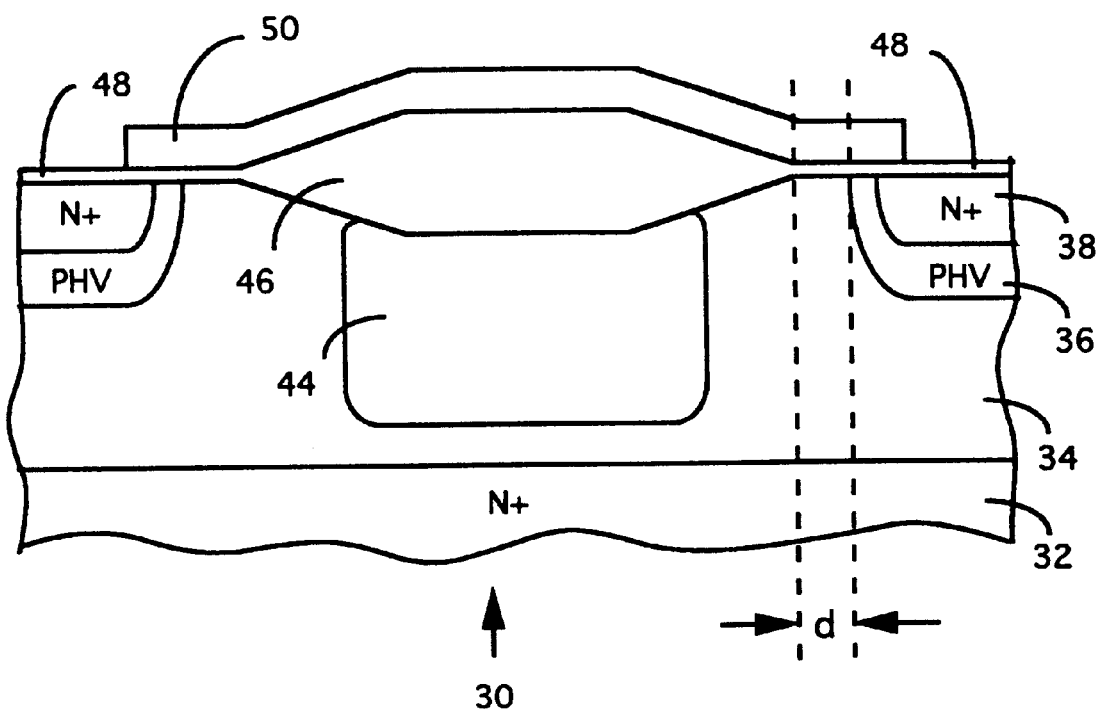
FIG. 3 is a cross sectional view of a prior art DMOS device having a field oxide formed in the channel between adjacent transistors.

Referring to FIG. 3B for the top view of the MOSFET device 100 where the cross sectional view as that shown in 2A is a cross sectional view along the line X–X'. The open gaps 127 filled with oxide plugs 128''' provide a special advantage to reduce the gate capacitance because the device has less gate oxide area. The switching speed of this power device is improved with reduced gate capacitance when the gapped-gates 125 are formed as that shown in FIGS. 2A and 2B.

Referring to FIGS. 5A to 5I for the processing steps applied to manufacture the MOSFET device 100. As shown in FIG. 4A, the processing steps begins by first growing a N-epitaxial layer 110 with a resistivity ranging from 0.1 to 10 ohm-cm on top of a N+ substrate 105. The substrate has a resistivity of 0.001 to 0.02 ohm-cm. The thickness and the resistivity of the epitaxial layer 110 depend on the requirements for the on-resistance and breakdown voltage. In a preferred embodiment, the thickness of the epi-layer 110 is about six to eight microns. A gate oxide layer 120 of thickness in the range of 100 to 1000 Angstroms is grown. A polysilicon layer 125 having a thickness of approximately 3000 to 10,000 Angstroms is then deposited. A $POCL_3$ doping process is carried out followed by an arsenic (As) implant process with an ion beam of energy at 60–80 Kev with a flux density in the range between 5 to $8 \times 10^{15}/cm^2$. An oxide layer 123 having a thickness ranging from 3000 to 7000 Angstroms are formed on top of the polysilicon layer 125. A specially configured polysilicon mask 129, i.e., a first mask, is applied for carrying out an anisotropic etching to pattern the cap-oxide layer 123 and the polysilicon layer 125.

In FIG. 5B, after an an-isotropic etching is carried out to define a plurality of gapped-gates 125 each covered with a oxide-cap 123 in the core cell area 102. These gapped-gates 125 including the oxide-cap each defines a gate oxide-plug opening 127 in the center. The gate oxide-plug openings 127 having a width of about 0.5 to 2.0 micrometers. In the termination area, there are two segments, i.e., segments 125' and 125" of the polysilicon each covered with a oxide-cap 123, on the peripheral portion. These two segments are provided to form the field plate (FP) and equal potential ring (EQR). These two segments are defined to have an arrow gap 126 of about 0.5 to 2.0 micrometers in gap width.

Referring to FIG. 5C, a NSG layer 128 of 0.5 to 1.0 micrometer in thickness is deposited. For the gate oxide-plug openings 127 and the narrow gap 126 between the polysilicon segments 125' and 125", since the aspect ratio, i.e., the ratio of the width to the depth of the gap 126 and the gate oxide-plug openings 127, is equal to or greater than 0.5, the NSG layer 128 fills the gate oxide-plug openings 127 and the gap 126 without a significant dip caused by the variations of height across gate oxide-plug openings 127 and the gap 126, and the top surface is approximately a flat surface.

Referring to FIG. 5D, an anisotropic dry etch process is performed to remove the entire NSG layer 128 except the side-wall spacers 128' around the edges of the polysilicon gates 125. Also, the NSG layer 128 filling the gate oxide-plug openings 127 and the gap 126 functioning as an oxide plug 128" remains substantially intact except a very thin layer is removed from the top of the gate oxide-plug openings 127 and the gap 126. Thus the oxide plug 128" filling the gapped-hoes 127 and the gap 126 basically has a same thickness as the total height of the stack structure consisted of the polysilicon gate layer 125 covered with the oxide-cap layer 123. The oxide plugs 128" formed in the gate oxide-plug openings 127 and the gap 126 are used to block subsequent p-body implant from entering into the silicon layer underneath the oxide plug 128''' and 128". A potential problem arising from a low breakdown voltage when additional body dopant region is formed between the field plate and the equal protection ring (EQR) is therefore eliminated with the oxide plug 128" formed in the termination area between the field plate 125' and the EQR 125". The oxide plug 128" formed in the gap 126 therefore provides the advantage that an initial oxide layer commonly used to prevent a body dopant region from being implanted between the field plate and the EQR is no longer required. Meanwhile the oxide plug 128''' filled the gate oxide-plug openings 127 also prevent the body dopant from entering into the substrate. The gate-to-drain capacitance is thus reduced with the total polysilicon areas now reduced by the gate oxide-plug openings filled with the oxide plugs 128'''.

Cost savings are achieved by manufacturing the MOSFET device without using an initial mask because of this advantages of using an oxide plug 128" filling the gap between the field plate 125' and the EQR 125". A p-body implant at 30–80 Kev with an ion beam of $3 \times 10^{13}$ to $3 \times 10^{14}/cm^2$ flux density is applied to implant the p-body regions 130. The oxide plugs 128''' in the gate oxide-plug openings 127 and the oxide plug 128" filling the gap 126 between the field plate and the EQR block the p-body dopant from entering the substrate. A p-body diffusion process is then carried out at an elevated temperature of 1,000–1,200° C. for ten minutes to three hours to increase the depth of the p-body region 130 to 1.0–6.0 µm.

Referring to FIG. 5E, a high energy body implant is carried out by either skipping a step of growing an implant oxide layer or implanting with an implant angle smaller than seven degree (7°), e.g., at zero degree relative to the perpendicular direction to the top surface of the substrate, to form a deep high concentration body region 165 with boron ions of an ion flux of about $3 \times 10^{14}$ to $1 \times 10^{16} / cm^2$ at about 100 to 300 Kev. The device ruggedness is improved by performing this high energy body dopant implant to form a deep high dopant concentration region. The concern of increasing the device threshold voltage due to a lateral diffusion of the deep high concentration body dopant regions to touch the channel regions are resolved. On the one hand the high energy body dopant implant is self aligned. The high energy body dopant ions are blocked by the polysilicon-with-oxide-cap segments and the gate oxide plugs 128" which has greater thickness than conventional gates. The side-wall spacers 128' around the polysilicon-with-oxide-cap segments serve the function of self aligning the implanted body ions to keep the body dopant at a distance away from the edges of the gates. On the other hand, the high energy body dopant implant is carried out after the body region diffusion. The lateral diffusion of the deep high concentration body dopant region 165 are limited with thermal cycles of lower temperatures and shorter duration as will be described below. The difficulties caused by the misalignment problems as that encountered in Tsoi's patent are therefore resolved by the use of the oxide caps 123, the oxide plugs 128", and the side-wall spacers 128'.

Referring to FIG. 5F, a source blocking mask is applied to carry out a source implant with a source ion beam of either a phosphorous ions at an energy of 60–100 Kev and ion flux density of $5 \times 10^{15}$ to $1 \times 10^{16}/cm^2$ or an arsenic ion beam at an energy of 60–150 Kev and ion flux density of $1 \times 10^{15}$ to $1 \times 10^{16}/cm^2$ to form the source regions 140. The oxide side-wall spacers 128' around the gates 125 function as a source implant blocks. The source implant is carried out to self align at a pre-designated distance away from the edges of the gate 125.

In FIG. 5G, a BPSG or PSG layer is deposited to form an insulation layer 145 of approximately 5000–15000 Å in thickness. A contact mask (not shown) is applied to first perform a dry etch to etch the insulation layer 145 to define a plurality of contact windows 150. Because of the side-wall spacers 128' now surrounding the edges of the polysilicon-with-oxide-cap segments, the misalignment tolerances of the contact mask is also increased thus the manufacture process of applying the contact mask can be more easily carried out without being limited with strict tolerance requirements of misalignment. A shallow body implant is performed to form a shallow high concentration body region 160 with either a low energy boron implant with an ion flux of $1\times10^{14}$ to $2\times10^{15}/cm^2$ at about 20 to 60 Kev or a high energy $BF_2$ implant with an ion flux of $1\times10^{14}/cm^2$ to $2\times10^{15}$ at about 100–240 Kev.

Referring to FIG. 5H, the contact mask 148 is removed. A BPSG reflow and densification process is performed at 900–950° C. for thirty minutes to one hour. The source regions 140 are driven to desired junction depth ranging from 0.2 to 1.0 μm by a the elevated temperature and the shallow and deep high concentration body dopant regions 160 and 165 are also driven to a deeper depth in the body regions 130. A metal layer is deposited to form a metal layer 170 and a metal mask is applied to define a plurality of metal segments, including source metal 170-1, gate metal 170-2, field plate 170-3 and equal potential ring (EQR) 170-4. An anisotropic dry etch is performed in defining these metal segments 170-1 to 170-3 to separate these metal segments with a deep and narrow gap 175-1 to 175-3. These deep and narrow gaps have an aspect ratio equal to or greater than 0.5 wherein. The aspect ratio is defined as:

$$\text{Gap Aspect Ratio}=(\text{Depth of Gap})/(\text{Gap Lateral Width}) \quad (3)$$

For gaps 175-1 to 175-3:

$$\text{Aspect Ratio of Gaps} \geq 0.5 \quad (4)$$

The gap width of about one to four micrometers and a depth of about three to five micrometers. The depth of the gaps 175-1 to 175-3 is essentially the same as the thickness of the metal contact layer 170. A passivation layer composed of mobile ion blocking materials such as PSG, nitride or oxyin nitride ($Si_xN_yO_z$) or combination of PSG and nitride, is deposited over the entire top surface of the device. With the gap aspect ratio equal to or greater than 0.5, the mobile ion blocking material also fill up the deep and narrow gaps 175-1 to 175-3 between the metal segments.

Figure 5I:
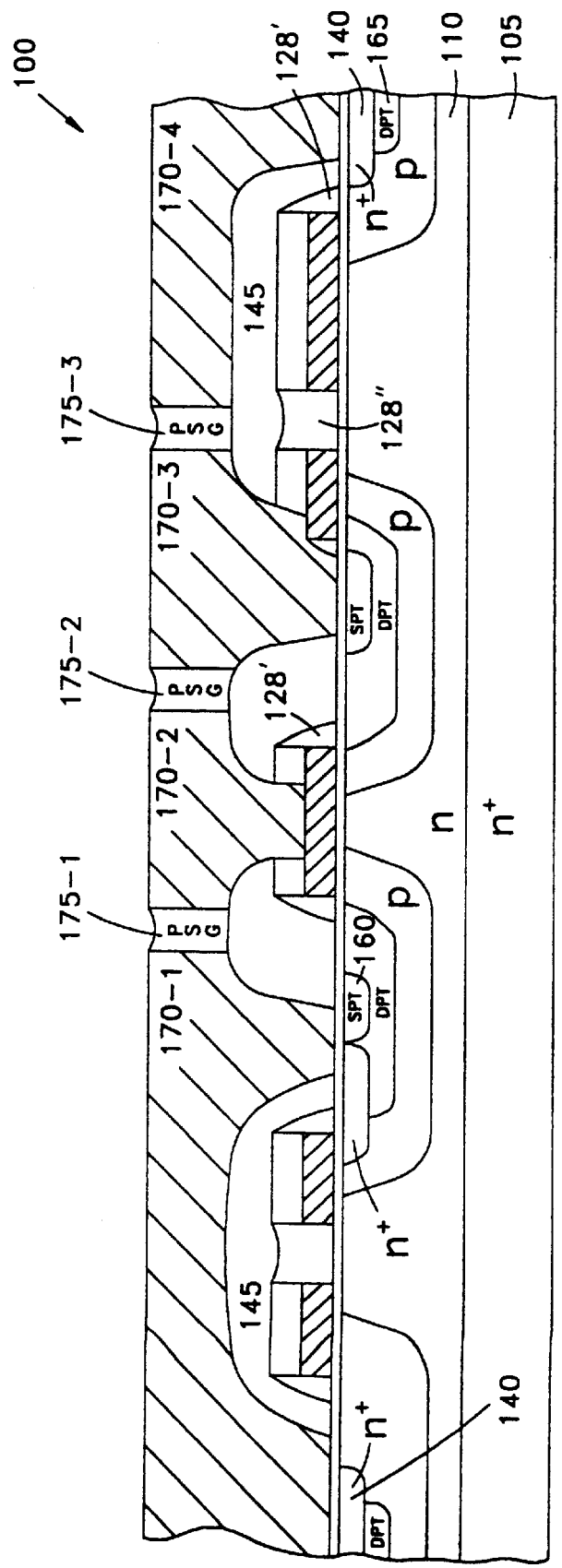

Referring to FIG. 5I, a dry etching process is performed without applying a pad mask to remove the entire layer of the passivation material from the top surface. In dry etching the top layer away, only a small portion from the top of the mobile ion blocking material filled in the between-the-contact gaps 175-1 to 175-3 is removed while the major portions of the filling material in these deep and narrow gaps 175-1 to 175-3 composed of mobile ion blocking material are kept intact.

Figure 6:
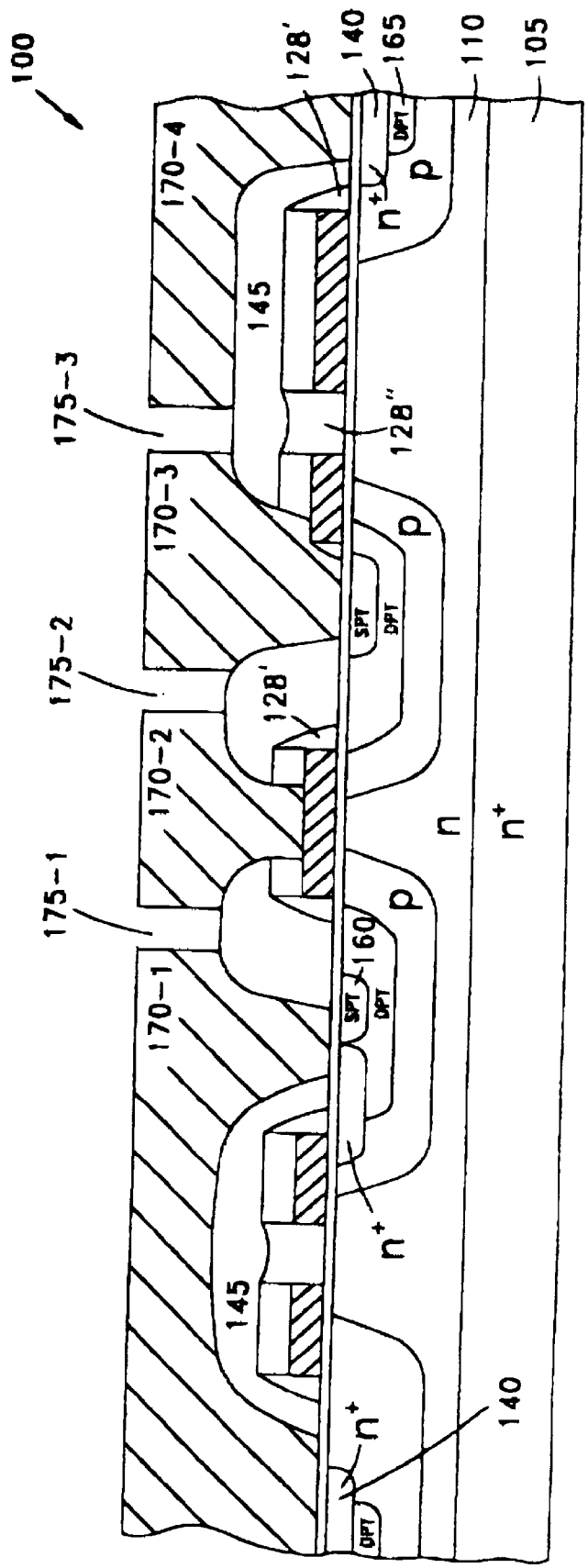
FIG. 6 is a cross sectional view showing the filling of a deep and narrow gap when an aspect ratio is equal to or greater than 0.5.

FIG. 6 is a cross section view for one of the deep and narrow gaps 175-1 to 175-3 with aspect ratio equal to 0.5. When a passivation layer with a layer thickness T is deposited over the top surface, the gap which has an aspect ratio of 0.5, i.e., has a lateral gap width of 2T, is filled up with the passivation layer because the layer has a thickness T and the gap width is 2T. By controlling the aspect ratio of the gaps 175-1 to 175-3, a thick passivation layer which is almost as thick as the metal layer can be formed.

According to FIGS. 4A to 6 and the above description, this invention discloses a MOSFET power device supported on a substrate. The MOSFET power device includes a plurality polysilicon-with-oxide-cap segments disposed over a gate oxide layer including two outermost segments and a plurality of inner segments include a plurality of gate oxide-plug openings wherein each of the inner segments functioning as a gate and the two outermost segments functioning as a field plate and an equal potential ring separated by a termination oxide-plug gap and the gate oxide-plug openings and the termination oxide-plug gap having an aspect ratio greater or equal to 0.5. The MOSFET power device further includes a plurality of MOSFET transistor cells for each of the gates, wherein each transistor cells further includes a source region, a body region, the transistor cells further having a common drain disposed at a bottom surface of the substrate. Each of the inner segments functioning as a gate having a side wall spacer surrounding edges of the inner segments, and the gate oxide-plug openings and the termination oxide-plug gap being filled with an oxide plug. The MOSFET transistor cells are covered by an overlying insulation layer having a plurality of contact openings defined therein. The MOSFET power device further includes a plurality of metal segments covering the overlying insulation layer and being in electric contact with the DMOS device through the contact opening. The MOSFET power device further includes a plurality of deep-and-narrow gaps between the metal segments wherein each gap having an aspect ratio equal to or greater than 0.5.

In a preferred embodiment, the field plate has a width less than a lateral diffusion of a body dopant whereby the body dopant in forming the body regions extending toward the equal potential ring beyond the field plate. In a preferred embodiment, an oxide plug filling the gate oxide-plug openings and the oxide plug separating the field-plate from the equal potential ring having substantially a same thickness as the plurality of polysilicon-with-oxide-cap segments. In a preferred embodiment, the gate oxide-plug openings and the termination oxide-plug-gap separating the field-plate from the equal potential ring having a width ranging from 0.5 to 4.0 micrometers. In a preferred embodiment, the MOSFET power device further includes a deep high concentration body dopant regions for each of the MOSFET transistor cells disposed under the source regions. The polysilicon-with-oxide-gap segments have a thickness sufficient to block a plurality high energy dopant ions from entering the substrate in forming the deep high concentration body dopant regions. In a preferred embodiment, the polysilicon-with-oxide-gap segments having a thickness ranging from 0.2 to 0.6 micrometers. In a preferred embodiment, the side-wall spacers surrounding the polysilicon-with-oxide-cap segments having a width to block the high energy body dopant ions from laterally diffusing to a channel region in each of the MOSFET transistor cells.

In summary, this invention further discloses a semiconductor substrate provided for supporting a power device thereon. The semiconductor substrate includes a gate oxide layer covering the substrate. The substrate further includes a plurality of polysilicon-with-oxide-cap segments disposed over the gate oxide layer including two outermost segments and inner segments having a plurality of gate oxideplug openings wherein each of the inner segments functioning as a gate and the outermost segments functioning as a field pate segment and an equal potential ring segment separated by a termination oxide-plug gap having an aspect ratio greater or equal to 0.5. In a preferred embodiment, each of the inner segments functioning as a gate having a side wall spacer surrounding edges of the inner segments, and the gate oxide-plug openings and the termination oxide-plug gap being filled with an oxide plug. In a preferred embodiment, the semiconductor substrate further includes a plurality of power transistor cells disposed in the substrate for each of the gates covered by an overlying insulation layer having a plurality of contact openings defined therein. The semiconductor substrate further includes a plurality of metal segments covering the overlying insulation layer and being in electric contact with the power transistor cells through the contact openings. The semiconductor substrate further includes a plurality of deep-and-narrow gaps between the metal segments wherein each gap having an aspect ratio equal to or greater than 0.5.

According to FIGS. 4A to 6 and the above description, this invention discloses a method for fabricating a MOSFET device supported on a substrate 105. The method includes the steps of (a) growing an oxide layer 120 on the substrate and depositing a polysilicon layer 125 followed by forming an oxide-cap layer 123 covering the polysilicon layer 125; (b) applying a gate mask 129 for forming a plurality of polysilicon-withoxide-cap segments including a plurality of inner gate-segments 125 each having a gate oxide-plug opening 127 and a field plate segment 125' and an equal potential ring segment 125" separated by a gap 126; (c) depositing a NSG layer 128 overlying the top surface followed by applying an anisotropic dry etch for selectively removing the NSG layer 128 and forming an oxide plug 128'" and 128" filling respectively the gate oxide-plug openings 127 and a gap 126 between the field plate and the equal potential ring (EQR) polysilicon segments 125' and 125" and a plurality of side wall spacers 128' around the gates 125; (d) implanting a body dopant followed by a body diffusion for forming body regions 130; (e) performing a high energy body dopant implant for forming deep high concentration body dopant regions 165 in the body region; (f) applying a source mask 135 for implanting a source dopant to form a plurality of source regions 140; (g) forming an overlying insulation layer 145 covering the MOSFET device followed by applying a dry oxide etch with a contact mask to open a plurality of contact openings there-through; (h) performing a low energy body dopant implant to form a plurality of shallow high concentration body dopant regions 160 in the body regions 130 then removing the contact mask; (i) performing a high temperature reflow process for the overlying insulation layer and for driving the source regions 140 and the shallow and deep high concentration body dopant regions 160 and 165 respectively into designed junction depths; (j) depositing a metal layer 170 followed by applying a metal mask for patterning the metal layer to define a plurality of metal segments by employing an anisotropic dry etch thus defining a plurality of deep-and-narrow gaps 175-1 to 175-3 between the metal segments wherein each gap having an aspect ratio equal to or greater than 0.5; (k) depositing a passivation layer over an entire top surface and filling the deep-and-narrow gaps between the metal segments; and (l) etching away the passivation layer over the entire top surface without applying a mask while leaving the passivation layer inside the deep-and-narrow gaps substantially intact for serving a function of blocking mobile ions from entering into the MOSFET device.

In a preferred embodiment, the step (b) of applying a gate mask for anistropically dry-etching the annular field plate annular and the equal potential ring annular segments is a step of dry-etching the polysilicon layer to form the field plate annular segment 125' having a width less than a lateral diffusion of the body dopant. In another preferred embodiment, the step (c) of depositing a NSG layer 128 overlying the top surface is a step of filling the gate oxide-plug openings 127 for each of the gate-segments and the termination oxide-plug gap 126. The step of applying an anisotropic dry etch for selectively removing the NSG layer 128 is a step of selectively removing the NSG layer above the gate oxide-plug openings 127 and termination oxide-plug gap 126 while leaving the NSG layer in the gate oxide-plug openings and termination oxide-plug gap substantially intact for blocking the body dopant ions from entering into the epitaxial layer 110. The capacitance between the gate and drain is reduced because of the gate-oxide-plugs 128'". The self alignment for implanting the p-body is achieved with the gate oxide plug 128'" and the side wall spacers 128' blocking the body implant dopants of different energy levels. In another preferred embodiment, the step (b) of etching the gate oxide-plug openings 127 for each of the gate-segments and the termination oxide-plug gap 126 between the field plate 125' and the equal potential ring 125" is a step of dry etching the gate oxide-plug openings and the termination oxide-plug gap 126 with width substantially between 0.5 to 4.0 micrometers. In another preferred embodiment, the step (a) of forming an oxide-cap layer is a step of forming the oxide layer having a total combined thickness with the polysilicon layer sufficient to block a plurality of high energy body dopant ions from entering into the substrate in performing the high energy body dopant implant in the step (e). In another preferred embodiment, the step of forming the total combined thickness of the oxide cap layer and the polysilicon layer sufficient to block a plurality of high energy body dopant ions from entering into the substrate is a step of forming the cap-oxide layer with a thickness of 0.20.6 micrometers. In another preferred embodiment, the step (b) of anistropically dry-etching a plurality of polysilicon-with-oxide-capsegments including a plurality of inner gate-segments, a field plate annular segment and an equal potential ring annular segment, is a step of forming a side-wall spacer 128' surrounding each of the segments. In another preferred embodiment, the step of forming a side-wall spacer 128' surrounding each of the segments is a step of forming the side-wall spacer with a width to block body dopant ions employed in the high energy body dopant implant whereby the body dopant ions are prevented to diffuse to a channel region.

In summary, this invention also discloses a method for fabricating a semiconductor power device supported on a substrate comprising steps of: (a) growing the layer 120 on the substrate followed by depositing a gate layer 125 and oxide-cap layer 123 then applying a gate mask for forming a plurality of gate-with-oxide-cap segments wherein a plurality of inner segments having a gate oxide-plug opening 127 and two outermost segments 125' and 125" separated by a termination oxide-plug gap 126 having an aspect ratio greater than or equal to 0.5. In a preferred embodiment, the method further includes a step of (b) depositing an implant blocking layer 128 overlying a top surface followed by applying an anisotropic dry etch for selectively removing the implant blocking layer and forming a plurality of side-wall spacers 128' around the gate with-oxide-cap segments each functioning as a gate and for filling the gate oxide-plug openings 127 and the termination oxide-plug gap 126 between the two outermost polysilicon segments 125' and 125" functioning as a field plate and an equal potential ring separated by the oxide plug. In a preferred embodiment, the method further includes a step of (c) performing body dopant implant followed by a body diffusion to form a plurality of body regions 130 and then performing a high energy body dopant implant to form a plurality of deep high concentration body dopant regions 165 in the body regions.

Therefore, the present invention provides a new MOSFET fabrication process and a new device structure to enable those of ordinary skill in the art of MOSFET fabrication to reduce gate-to-drain capacitance to achieve higher device switching speed and meanwhile applying a simplified manufacturing process with reduced number of masks whereby the device performance and reliability are both improved such that limitations and difficulties encountered in the prior art are overcome. Specifically, a plurality of oxide plug openings are opened in the gate layer filled with oxide-plug for each gate to reduce the effective charge retaining area for the gate to reduce the gate-to-drain capacitance such that the switching speed is improved and the number of masks required is reduced for manufacturing a MOSFET power device. Furthermore, deep high body dopant concentration regions are implanted with self alignment with the high energy dopant ions blocked by gate-with-oxide-cap segments having oxide plugs filling the gate oxide-plug openings in the polysilicon layer and the side-wall spacers surrounding the edges of the gate-with-oxide-cap segments such that the device ruggedness is improved without causing increase in threshold voltage. Also, the deep high body dopant concentration regions are implanted after a body diffusion process such that with subsequent thermal cycles of lower temperature and shorter duration, the lateral diffusion of this deep high concentration body dopant region is limited without extending to a region near the channel and the potential difficulty of increasing the threshold voltage is resolved. Additionally, the mix-alignment tolerances of the contact mask is increased with the side-wall spacers surrounding the edges of the gate-with-oxide-cap segments such that the process of applying the contact mask can be more easily carried out without being restrict by a stringent misalignment tolerance requirement. Improved structure in the termination area is also provided with a field plate (FP) insulated from an equal potential ring (EQR) by an oxide plug having about the same thickness of the field plate and equal potential ring to block the body dopant ions such that a thick initial oxide layer is no longer needed and the requirement of applying a separate active mask specifically for defining the active area by etching away a thick initial oxide layer is eliminated. The requirement of applying a separate pad masks specifically for defining the passivation layer to expose the areas above the source and gate metal segments are eliminated while a mobile ion blocking layer of greater thickness is provided such that the number of masks required to fabricate a MOSFET transistor can be reduced and the device reliability can be improved. By applying a dry etch process to pattern the polysilicon covered with an oxide-cap layer to define the gate oxide-plug openings in the polysilicon layer with aspect ratio greater than or equal to 0.5, a separate mask is not required to form a plurality of oxide plugs in the gate oxide-plug openings to reduce the gate-to-drain capacitance and to serve the functions of blocking body dopant ions from entering into the substrate through the gate oxide-plug openings in the gate polysilicon layer.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A method for fabricating a MOSFET device supported on a substrate comprising steps of:

(a) growing an oxide layer on said substrate and depositing a polysilicon layer followed by forming an oxide cap layer overlying said polysilicon layer;

(b) applying a gate mask for anistorpically dry-etching a plurality of polysilicon-with-oxide-cap segments including a plurality of inner gate-segments each having a gate oxideplug opening and a field plate annular segment and an equal potential ring annular segment separated by a termination oxide-plug gap wherein said gate oxide-plug openings and said termination oxide-plug gap having an aspect ratio equal to or greater than 0.5;

(c) depositing a NSG layer overlying said top surface followed by applying an anisotropic dry etch for selectively removing said NSG layer, and forming an oxide plug filling said gate oxide-plug openings and filling said termination oxide-plug gap between said field plate and said equal potential ring (EQR) polysilicon segments, and a plurality of side wall spacers around said gate-segments;

(d) implanting a body dopant followed by a body diffusion for forming body regions;

(e) performing a high energy body dopant implant for forming deep high concentration body dopant regions in said body region;

(f) applying a source mask for implanting a source dopant to form a plurality of source regions;

(g) forming an overlying insulation layer covering said MOSFET device followed by applying a dry oxide etch with a contact mask to open a plurality of contact openings saidre-through;

(h) performing a low energy body dopant implant to form a shallow high concentration body dopant in said body regions then removing said contact mask;

(i) performing a high temperature reflow process for said overlying insulation layer and for driving said source regions and said shallow and deep high concentration body dopant regions into designed junction depths;

(j) depositing a metal layer followed by applying a metal mask as a third mask for patterning said metal layer to define a plurality of metal segments by employing an anisotropic dry etch thus defining a plurality of deep-and-narrow gaps between said metal segments wherein each gap having an aspect ratio equal to or greater than 0.5;

(k) depositing a passivation layer over an entire top surface and filling said deep-and-narrow gaps between said metal segments; and (l) etching away said passivation layer over said entire top surface without applying a mask while leaving said passivation layer inside said deep-and-narrow gaps substantially intact for serving a function of blocking mobile ions from entering into said MOSFET device.

2. The method of fabricating said MOSFET device as recited in claim 1 wherein:

said step (b) of applying a gate mask for anistropically dry etching said annular field plate annular and said equal potential ring annular segments is a step of dry-etching said polysilicon layer to form said field plate annular segment having a width less than a lateral diffusion of said body dopant.

3. The method of fabricating said MOSFET device as recited in claim 2 wherein:

said step (c) of depositing a NSG layer overlying the top surface is a step of filling said gate oxide-plug openings for each of said gate-segments and filing said termination oxide-plug gap; and said step of applying an anisotropic dry etch for selectively removing said NSG layer is a step of selectively removing said NSG layer above said gate oxide-plug openings and termination oxide-plug gap while leaving said NSG layer in said gate oxide-plug openings and termination oxide plug gap substantially intact.

4. The method of fabricating said MOSFET device as recited in claim 2 wherein:

said step (b) of etching said gate oxide-plug openings for each of said gate-segments and said termination oxide-plug gap between said Field plate and said equal potential ring is a step of dry etching said gate oxide-plug openings and said termination oxide-plug gap with width substantially between 0.5 to 4.0 micrometers.

5. The method of fabricating said MOSFET device as recited in claim 2 wherein:

said step (a) of forming an oxide-cap layer is a step of forming said oxide layer having a total combined thickness with said polysilicon layer sufficient to block a plurality of high energy body dopant ions from entering into said substrate in performing said high energy body dopant implant in said step (e).

6. The method of fabricating said MOSFET device as recited in claim 5 wherein:

said step of forming said total combined thickness of said oxide cap layer and said polysilicon layer sufficient to block a plurality of high energy body dopant ions from entering into said substrate is a step of forming said cap-oxide layer with a thickness of 0.2–0.6 micrometers.

7. The method of fabricating said MOSFET device as recited in claim 1 wherein:

said step (b) of anistropically dry-etching a plurality of polysilicon-with-oxide-cap segments including a plurality of inner gate-segments, a field plate annular segment and an equal potential ring annular segment, is a step of forming a side-wall spacer surrounding each of said segments.

8. The method of fabricating said MOSFET device as recited in claim 6 wherein:

said step of forming a side-wall spacer surrounding each of said segments is a step of forming said side-wall spacer with a width to block body dopant ions employed in said high energy body dopant implant whereby said body dopant ions are prevented to diffuse to a channel region.

9. The method of fabricating said MOSFET device as recited in claim 1 wherein:

said step (b) of employing an anisotropic dry etch for defining a plurality of deep-and-narrow gaps between said metal segments is a step of etching said deep-and-narrow gaps between said metal segments substantially having a width of approximately one to four micrometers.

10. The method for fabricating said MOSFET device of claim 1 wherein:

said step (k) of depositing a passivation layer over an entire top surface and filling said deep-and-narrow gaps between said metal segments is a step of depositing a mobile ion blocking layer of PSG over said top surface and filling said deep-and-narrow gaps.

11. The method for fabricating said MOSFET device of claim 1 wherein:

said step (k) of depositing a passivation layer over an entire top surface and filling said deep-and-narrow gaps between said metal segments is a step of depositing a mobile ion blocking layer of silicon nitride over said top surface and filling said deep-and-narrow gaps.

12. The method for fabricating said MOSFET device of claim 1 wherein:

said step (k) of depositing a passivation layer over an entire top surface and filling said deep-and-narrow gaps between said metal segments is a step of depositing a mobile ion blocking layer of oxynitride over said top surface and filling said deep-and-narrow gaps.

13. The method for fabricating said MOSFET device of claim 1 wherein:

said step (k) of depositing a passivation layer over an entire top surface and filling said deep-and-narrow gaps between said metal segments is a step of depositing a mobile ion blocking layer of a combination of PSG and silicon nitride or oxynitride over said top surface and filling said deep-and-narrow gaps.

14. The method for fabricating said MOSFET device of claim 1 wherein:

said step (k) of depositing a metal layer to form electric contacts through said contact openings further comprising a step of controlling a thickness of said metal layer for controlling a depth of said deep-and narrow gaps between said metal segments.

15. A method for fabricating a semiconductor power device supported on a substrate comprising steps of:

(a) growing a layer on said substrate followed by depositing a gate layer and oxide-cap layer then applying a gate mask for forming a plurality of gate-with-oxide-cap segments wherein a plurality of inner segments having a gate oxide-plug opening and two outermost segments separated by a termination oxide-plug gap having an aspect ratio greater than or equal to 0.5.

16. The method for fabricating the power device of claim 15 further comprising:

(b) depositing an implant blocking layer overlying a top surface followed by applying an anisotropic dry etch for selectively removing said implant blocking layer and forming a plurality of side-wall spacers around said gate with-oxide-cap segments each functioning as a gate and for filling each of said gate oxide-plug openings with a gate oxide-plug and said termination oxide plug between said two outermost polysilicon segments with a termination oxide plug.

17. The method for fabricating the power device of claim 16 further comprising:

(c) performing body dopant implant followed by a body diffusion to form a plurality of body regions and then performing a high energy body dopant implant to form a plurality of deep high concentration body dopant regions in said body regions.

18. The method for fabricating the power device of claim 17 further comprising:

(c) forming a plurality of power transistor cells by forming a plurality of source regions in said substrate for each of said gates followed by forming an overlying insulation layer covering said power device and applying a contact mask to open a plurality of contact openings therethrough;

(d) depositing a metal layer to form electric contact through said contact openings;

(e) applying a metal mask for patterning said metal layer to define a plurality of metal segments by employing an anisotropic dry etch thus defining a plurality of deep-and-narrow gaps between said metal segments wherein each gap having an aspect ratio equal to or greater than 0.5;

(f) depositing a passivation layer over an entire top surface and filling said deep-and-narrow gaps between said metal segments; and (g) etching away said passivation layer over said entire top surface without applying a mask while leaving said passivation layer inside said deep-and-narrow gaps substantially intact for serving a function of blocking mobile ions from entering into said power device.

19. The method of fabricating said power device of claim 18 wherein:

said step (e) of applying a metal mask for patterning said metal layer to define a plurality of metal segments by employing an anisotropic dry etch is a step of patterning said metal layer for defining said metal segments to include a source metal, a gate metal, a field plate and an equal potential ring (EQR) wherein said metal segments are separated from each other with said deep-and-narrow gaps wherein each gap having an aspect ratio equal to or greater than 0.5.

* * * * *